United States Patent
Mimotogi et al.

[11] Patent Number: 5,889,686
[45] Date of Patent: Mar. 30, 1999

[54] PROFILE SIMULATION METHOD

[75] Inventors: Shoji Mimotogi; Soichi Inoue, both of Yokohama, Japan

[73] Assignee: Kabushiki Kaisha Toshiba, Kawasaki, Japan

[21] Appl. No.: 837,890

[22] Filed: Apr. 22, 1997

[30] Foreign Application Priority Data

Aug. 22, 1996 [JP] Japan ................................. 8-221357

[51] Int. Cl.$^6$ ................................................ G06F 17/50
[52] U.S. Cl. ........................ 364/578; 364/497; 356/399; 257/336
[58] Field of Search ..................... 364/578, 496, 364/497, 468; 356/399, 401; 257/336, 344

[56] References Cited

U.S. PATENT DOCUMENTS

| | | | |
|---|---|---|---|
| 5,379,225 | 1/1995 | Tazawa et al. | 364/468 |
| 5,434,440 | 7/1995 | Yoshitomi et al. | 257/344 |
| 5,745,388 | 4/1998 | Mimotogi et al. | 364/578 |

*Primary Examiner*—Kevin J. Teska
*Assistant Examiner*—Thai Phan
*Attorney, Agent, or Firm*—Oblon, Spivak, McClelland, Maier & Neustadt, P.C.

[57] ABSTRACT

A profile of a developed resist is exactly simulated irrespective of whether or not a resist pattern is dense. A dissolution rate of a film to be processed, which film is provided on a substrate, is varied in accordance with a concentration of a developer and the profile of the developed resist is simulated with use of the varied dissolution rate. In addition, a spatial average of an optical image of a resist, which is averaged in the thickness direction of the resist, is calculated and the dissolution rate of the resist is modulated by using the calculated spatial average. The profile of the resist is simulated by using the modulated dissolution rate. Therefore, the profile of the resist on the substrate, which profile varies when the resist is exposed in a desired pattern and developed, can be exactly estimated.

8 Claims, 6 Drawing Sheets

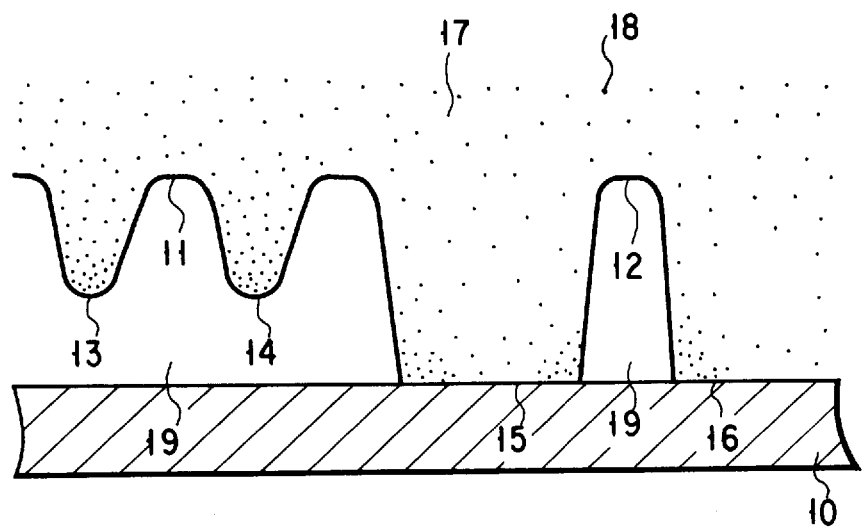
F I G. 1
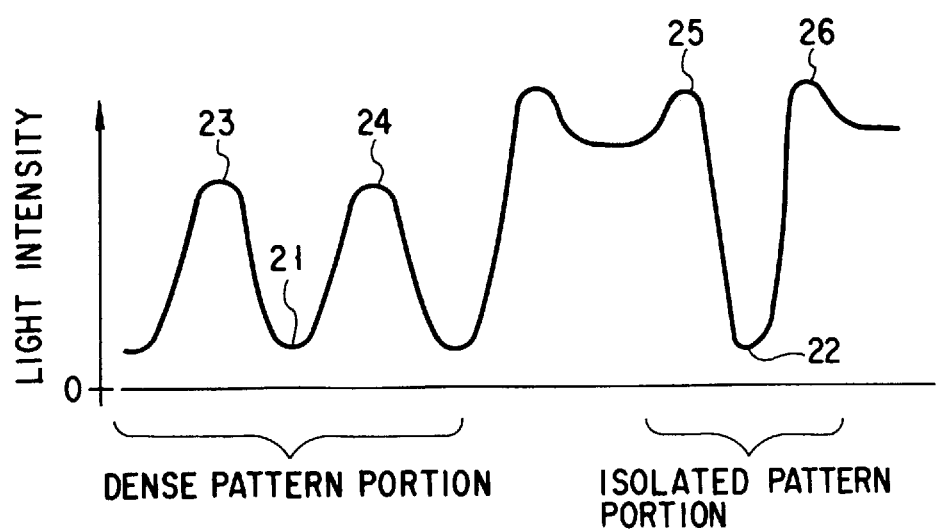
F I G. 2

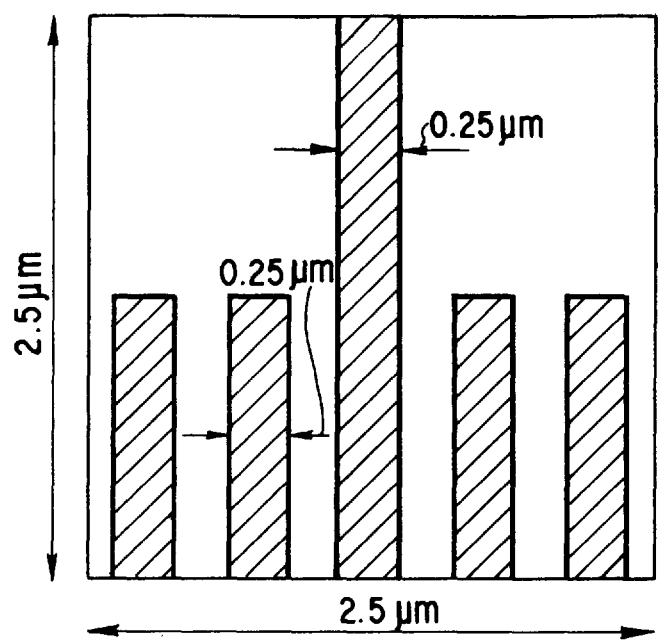
F I G. 7
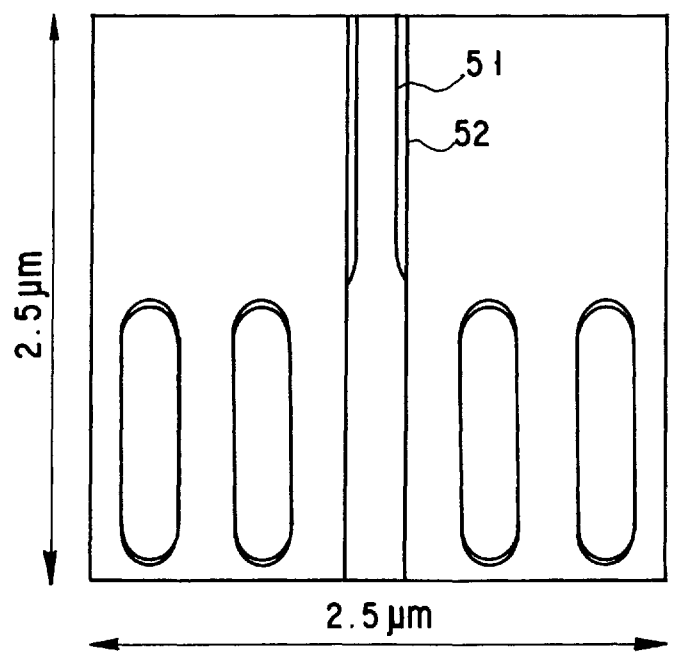
F I G. 8

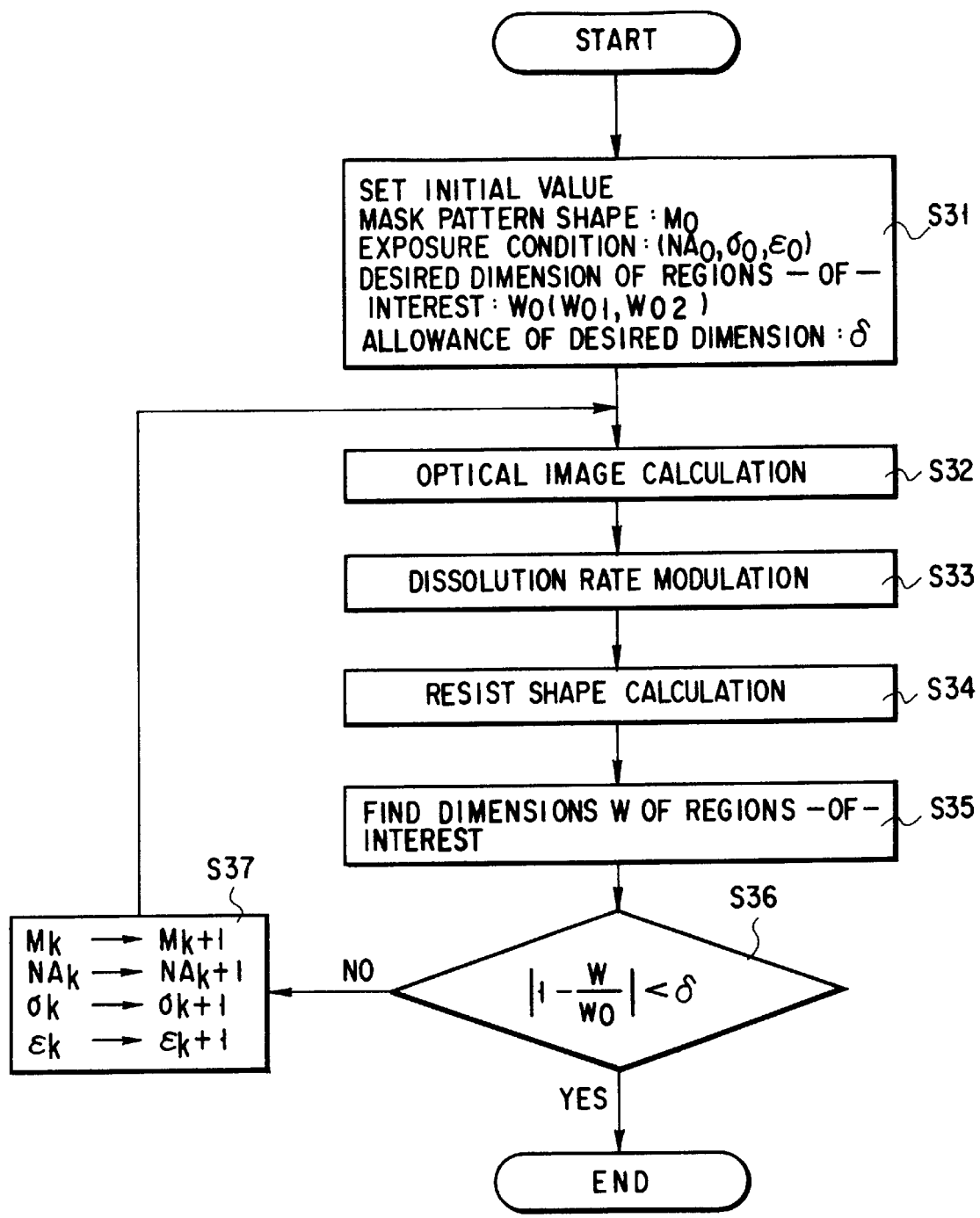
F I G. 9

PROFILE SIMULATION METHOD

BACKGROUND OF THE INVENTION

The present invention relates generally to a profile simulation method, and more particularly to a profile simulation method for forming an optimal resist pattern by estimating a variation in profile of a resist which is to be dissolved with a developer when a semiconductor device, etc. is manufactured by a lithography process, as well as a storage medium storing a program for carrying out the profile simulation method.

In a method of fabricating a semiconductor device, etc. by a lithography process, an image of a mask pattern is projected on a resist (photosensitive film) coated on a wafer and the image on the resist on the wafer is developed. For example, when the resist is of a positive type, a portion of the resist, which has been exposed to light to a greater degree, is dissolved with a developer and a resist pattern is formed.

The developed resist pattern varies depending on the focusing/defocusing state of a mask pattern image projected on the wafer, conditions for exposure (numerical aperture, coherence factor, shape of light source, pupil filter, etc.), a development time, the mask pattern itself, etc. Thus, a great number of experiments of exposure need to be conducted to find the conditions of the optical projecting system for producing a desired pattern with a predetermined focal depth and to find a mask pattern.

It is thus desirable to find, by computer simulation, the conditions in advance, under which an optimal resist profile will be developed. A method for estimating a developed resist profile is known as resist profile simulation, which will now be described.

When a two-dimensional profile alone is treated, a resist profile is expressed by a succession of minute line segments. When a three-dimensional profile is treated, a resist profile is expressed by a succession of minute plane segments. The direction of movement of the minute line segment or minute plane segment is set to be perpendicular to the surface of the resist. This technique is called "string model." On the other hand, in "ray tracing model", the direction of movement is found by a differential equations similar to those for light rays.

In addition, a method called "cell model" is known, wherein an object is divided into a group of small cells, and a variation in profile is expressed by deletion or addition of cells on the surface of the object. Moreover, there is known a distribution function method wherein the profile of an object is expressed by equivalent faces of a distribution function and a time-basis variation of the profile is found by solving a differential equation similar to a diffusion equation.

Besides, there is known a simplified development model wherein a point on a resist surface, where a dissolution rate is highest in a development process, is set as a start position and it is supposed that development progresses in a direction perpendicular to the substrate and then progresses in a direction parallel to the substrate and that the change in direction of development occurs at any point perpendicular to the substrate. According to this method, the profile of a developed resist is estimated on the basis of a group of end points.

However, the above methods have the following problems. In the prior art, the dissolution rate of a resist depends only on the exposure, photosensitivity characteristics of the resist and process conditions, or, in addition to these, the profile of a dissolved portion of the resist.

For example, when an isolated pattern portion and a dense pattern portion are coexisting, the concentration of a reaction product of a resist dissolved in a developer, that is, the $OH^-$ concentration in the developer, varies between a region near the isolated pattern portion and a region near the dense pattern portion. Consequently, the dimensions of a finished isolated pattern portion and those of a finished dense pattern portion cannot exactly be estimated at the same time.

As has been described above, various simulation methods have been proposed to estimate a resist pattern profile. In each method, it is not possible to exactly estimate the dimensions of a finished isolated pattern portion and those of a finished dense pattern portion at the same time. This problem arises not only in the case of forming a resist pattern but also in the case of treating a film by means of etching, etc.

BRIEF SUMMARY OF THE INVENTION

The present invention has been made in consideration of the above circumstances, and an object thereof is to provide a profile simulation method of exactly estimating a profile of a film to be processed, irrespective of whether a resist pattern is isolated or dense.

Another object of the invention is to provide a storage medium which stores a program for carrying out the above-mentioned simulation method under the control by a computer.

According to a first aspect of the invention, there is provided a profile simulation method for estimating a profile of a film to be processed, provided on a substrate, which profile varies due to dissolution in a developer, the method comprising:

a first step of calculating, on the basis of a dissolution rate of the film, a profile function variation amount representing a difference between a profile function representing the profile of the film at a first time point and a profile function at a second time point;

a second step of calculating a set of points having values of the profile function within a predetermined range between the first time point and the second time point;

a third step of lowering a dissolution component concentration of the developer among dissolution component concentrations, which dissolution component concentration is associated with the set of points;

a fourth step of calculating a variation amount between the dissolution component concentration at the first time point and the dissolution component concentration at the second time point;

a fifth step of calculating a dissolution rate of the film on the basis of a dissolution inhibitor concentration at the first time point and the dissolution component concentration of the developer;

a sixth step of varying the profile function, the dissolution component concentration and the first time point, respectively by the variation amount of the profile function, the variation amount of the dissolution component concentration and the variation amount between the first time point and the second time point;

a seventh step of determining whether or not the varied first time point has reached a development time of the film; and an eighth step of obtaining, when it has been determined that the varied first time point has reached the development time, the profile of the film by extracting equal-value faces of the varied profile function.

According to a second aspect of the invention, there is provided the profile simulation method according to first aspect, further comprising:

a ninth step of repeating the first to seventh steps until the varied first time point reaches the development time.

According to a third aspect of the invention, there is provided a computer program product for operating a computer, said computer program product comprising:

a computer readable medium;

first program instruction means for instructing a computer processor to calculate, on the basis of a dissolution rate of a film on a substrate, which film is dissolved in a developer, a profile function variation amount representing a difference between a profile function representing a profile of the film at a first time point and a profile function at a second time point;

second program instruction means for instructing the computer processor to calculate a set of points having values of the profile function within a predetermined range between the first time point and the second time point;

third program instruction means for instructing the computer processor to lower a dissolution component concentration of the developer among dissolution component concentrations, which dissolution component concentration is associated with the set of points;

fourth program instruction means for instructing the computer processor to calculate a variation amount between the dissolution component concentration at the first time point and the dissolution component concentration at the second time point;

fifth program instruction means for instructing the computer processor to calculate a dissolution rate of the film on the basis of a dissolution inhibitor concentration at the first time point and the dissolution component concentration of the developer;

sixth program instruction means for instructing the computer processor to vary the profile function, the dissolution component concentration and the first time point, respectively by the variation amount of the profile function, the variation amount of the dissolution component concentration and the variation amount between the first time point and the second time point;

seventh program instruction means for instructing the computer processor to determine whether or not the varied first time point has reached a development time of the film; and eighth program instruction means for instructing the computer processor to obtain, when it has been determined that the varied first time point has reached the development time, the profile of the film by extracting equal-value faces of the varied profile function, wherein each of said program instruction means is recorded on said medium in executable form and is loadable into the computer for execution by the processor.

According to a fourth aspect of the invention, there is provided the computer program product as set forth in third aspect, further comprising:

ninth program instruction means for instructing the computer processor to repeat the first to seventh steps until the varied first time point reaches the development time.

According to the present invention, it is possible to exactly estimate the profile of a film to be processed, irrespective of whether the resist pattern includes an isolated pattern portion or a dense pattern portion, by varying the processing speed at predetermined locations on the film in accordance with the degree of processing per unit time at the predetermined locations and the rate of dispersion of the film to the peripheral region thereof.

According to a fifth aspect of the invention, there is provided a profile simulation method for estimating a profile of a film to be processed, provided on a substrate, which profile varies due to dissolution in a developer, the method comprising:

a first step of calculating a distribution of an optical image of the film, which optical image has been averaged in a film thickness direction of the film;

a second step of calculating a spatial average of the averaged optical image distribution;

a third step of calculating a dissolution rate of the film;

a fourth step of modulating the calculated dissolution rate with use of the calculated spatial average; and a fifth step of simulating the profile of the film by using the modulated dissolution rate.

According to a sixth aspect of the invention, there is provided A computer program product for operating a computer, said computer program product comprising:

a computer readable medium;

first program instruction means for instructing a computer processor to calculate a distribution of an optical image on a film provided on a substrate, which optical image has been averaged in a film thickness direction of the film;

second program instruction means for instructing the computer processor to calculate a spatial average of the averaged optical image distribution;

third program instruction means for instructing the computer processor to calculate a dissolution rate of the film;

fourth program instruction means for instructing the computer processor to modulate the calculated dissolution rate with use of the calculated spatial average; and fifth program instruction means for instructing the computer processor to simulate the profile of the film by using the modulated dissolution rate, wherein each of said program instruction means is recorded on said medium in executable form and is loadable into the computer for execution by the processor.

According to this invention, a spatial average of an optical image of a film to be processed, which is averaged in the thickness direction of the film, is calculated and the dissolution rate of the film is modulated by using the calculated spatial average.

The profile of the film is simulated by using the modulated dissolution rate. Therefore, the profile of the film can be exactly estimated.

According to a seventh aspect of the invention, there is provided a profile simulation method for determining initial values for forming a film in a desired profile, the method comprising:

a first step of setting initial values for calculating an optical image of the film provided on a substrate;

a second step of calculating the optical image on the basis of the initial values;

a third step of varying a dissolution rate of the film on the basis of a dissolution component dissolving the film;

a fourth step of calculating a profile of the film by using the varied dissolution rate;

a fifth step of calculating dimensions of the film at a plurality of locations in the calculated profile of the film;

a sixth step of determining whether or not a difference between the calculated dimensions of the film and predetermined dimensions is within a predetermined range; and a seventh step of varying, when it has been determined that the difference between the calculated dimensions of the film and the predetermined dimensions is without the predetermined range, the initial values, and repeating the second to sixth steps.

According to an eighth aspect of the invention, there is provided A computer program product for operating a computer, said computer program product comprising:

a computer readable medium;

first program instruction means for instructing a computer processor to set initial values for calculating an optical image of the film provided on a substrate;

second program instruction means for instructing the computer processor to calculate the optical image on the basis of the initial values;

third program instruction means for instructing the computer processor to vary a dissolution rate of the film on the basis of a dissolution component dissolving the film;

fourth program instruction means for instructing the computer processor to calculate a profile of the film by using the varied dissolution rate;

fifth program instruction means for instructing the computer processor to calculate dimensions of the film at a plurality of locations in the calculated profile of the film;

sixth program instruction means for instructing the computer processor to determine whether or not a difference between the calculated dimensions of the film and predetermined dimensions is within a predetermined range; and seventh program instruction means for instructing the computer processor to vary, when it has been determined that the difference between the calculated dimensions of the film and the predetermined dimensions is without the predetermined range, the initial values, and repeating the second to sixth steps, wherein each of said program instruction means is recorded on said medium in executable form and is loadable into the computer for execution by the processor.

According to the present invention, it is possible to easily find conditions for exposure and a mask pattern for obtaining a desired resist pattern having a predetermined process allowance.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 shows a resist which is being subjected to a developing step;

FIG. 2 shows a relationship between the light intensity on an isolated pattern portion and the light intensity on a dense pattern portion;

FIG. 7 shows a simulated mask pattern in the profile simulation method according to the second embodiment;

FIG. 8 shows a result obtained by the profile simulation method according to the second embodiment; and FIG. 9 is a flow chart illustrating a profile simulation method according to a third embodiment of the present invention.

DETAILED DESCRIPTION OF THE INVENTION

Figure 3:
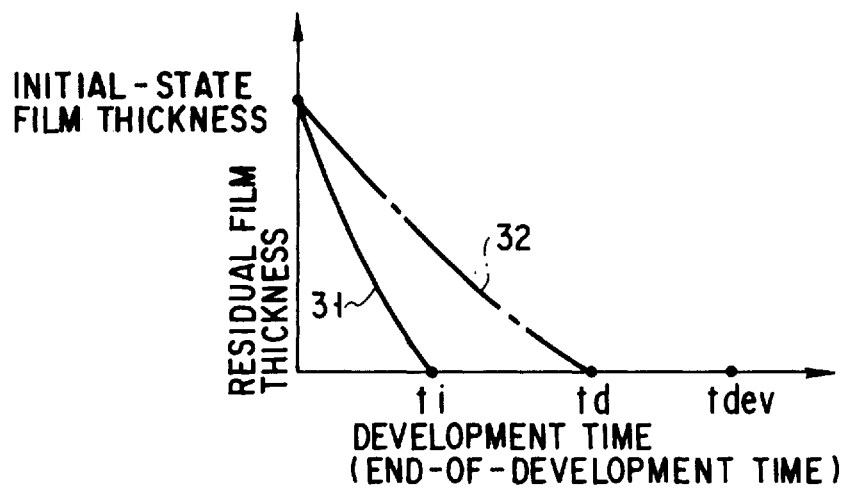
FIG. 3 is a graph showing a development time dependency of residual film thickness near an isolated pattern portion and a dense pattern portion.

At first, the background of profile simulation methods according to embodiments of the present invention will now be described with reference to FIGS. 1 to 3.

FIG. 1 shows a resist being subjected a development step.

As is shown in FIG. 1, a resist pattern comprises a dense pattern portion 11 and an isolated pattern portion 12.

In FIG. 1, reference numeral 10 denotes a substrate; 13 and 14 etched-away portions near the dense pattern portion; 15 and 16 etched-away portions near the isolated pattern portion 12; 17 a developer; 18 a dissolved resist portion or a reaction product; and 19 a resist.

FIG. 2 shows a relationship between the light intensity on an isolated pattern portion and the light intensity on a dense pattern portion.

As is shown in FIG. 2, the light intensity is high in etched-away portions 25 and 26 near an isolated pattern portion 22 and low in etched-away portions 23 and 24 near a dense pattern portion 21.

Accordingly, the dissolution rate of the resist in the peripheral portions 25 and 26 of isolated pattern portion 22 is higher than that of the resist in the peripheral portions 23 and 24 of concentrated pattern portion 21.

FIG. 3 is a graph showing a development time dependency of residual film thickness near the isolated pattern portion and dense pattern portion.

In FIG. 3, a curve 31 indicates the development time dependency of residual film thickness in the peripheral portions 15 and 26 of isolated pattern portion 12, and curve 32 indicates the development time dependency of residual film thickness in the peripheral portions 13 and 14 of dense pattern portion 11.

As is shown in FIG. 3, a resist etch-away time ti in the peripheral portions of isolated pattern portion 12 is less than a resist etch-away time id in the peripheral portions of dense pattern portion 11. Thus, the resist is etched away to the substrate earlier in the isolated pattern peripheral portions than in the dense pattern peripheral portions, and the time for forming the side wall of the pattern is longer.

The amount of the resist dissolved in the developer is great until the resist is etched away to the substrate. The dissolved resist is diffused in the developer. Since the amount of the dissolved resist per unit time is great, the $OH^-$ concentration lowers in the peripheral region of the dissolved resist. Accordingly, the dissolution rate of the resist in the dense pattern region decreases.

Subsequently, while the side wall of the pattern is being dissolved, the amount of resist dissolved in the developer decreases and thus the dissolution rate does not lower. Since the side-wall formation time (tdev-ti) in the isolated pattern peripheral region is longer than the side-wall formation time (tdev-td) in the dense pattern peripheral region, the dimensions of the isolated pattern become less than calculation results by the conventional profile simulation method wherein a variation in $OH^-$ concentration in the development step is ignored.

A resist pattern profile can be estimated by expressing the above physical phenomenon by a differential equation and solving the equation.

In the present invention, the processing rate of the film to be processed is varied in accordance with the amount of the film processed per unit time and the rate of dispersion of the film to the periphery. Thereby, a finished profile of a given pattern pitch can be exactly estimated, and a mask for obtaining a desired pattern can be easily designed.

Profile simulation methods according to embodiments of the present invention will now be described.

(First Embodiment)

A movement speed $R(x, y, z, t)$ of an interface between a resist and a developer varies depending on the concentration $M(x, y, z)$ of a dissolution inhibitor in the resist film and on the $OH^-$ concentration $C(x, y, z, t)$ in the developer in the vicinity of the interface between the resist and the developer. The dissolved resist diffuses in the developer. If the diffusion coefficient is D, the concentration $C(x, y, z, t)$ satisfies the following equation:

$$\frac{\partial C(x,y,z,t)}{\partial t} = D\nabla^2(x,y,z,t) \quad (1)$$

A profile function $P(x, y, z, t)$ expressing the presence/absence of the resist satisfies, with use of the speed of movement of the interface, the following equation:

$$\frac{\partial P(x,y,z,t)}{\partial t} = R(x,y,z,t)|\nabla P(x,y,z,t)| \quad (2)$$

The speed of movement, $R(x, y, z, t)$, is a function of the dissolution inhibitor concentration $M(x, y, z)$ and $OH^-$ concentration $C(x, y, z, t)$, and is given by:

$$R(x,y,z,t)=R[M\{E(x,y,z)\},C(x,y,z,t)] \quad (3)$$

The dissolution inhibitor concentration distribution M is obtained as a function of a light radiation distribution $E(x, y, z)$ within the resist film. By solving equations (1) to (3) without self-inconsistency, a resist profile after development can be found. For example, a specific expression of equation (3) is obtained, from a document, "J. P. Huang, T. K. Kwei and A. Reiser: Macromolecules", 1989, 22, p. 4106–4112, as follows:

$$R=k(1-M)^m C^n \quad (4)$$

where n and m are the orders of reaction, respectively, and k is a constant.

Figure 4:
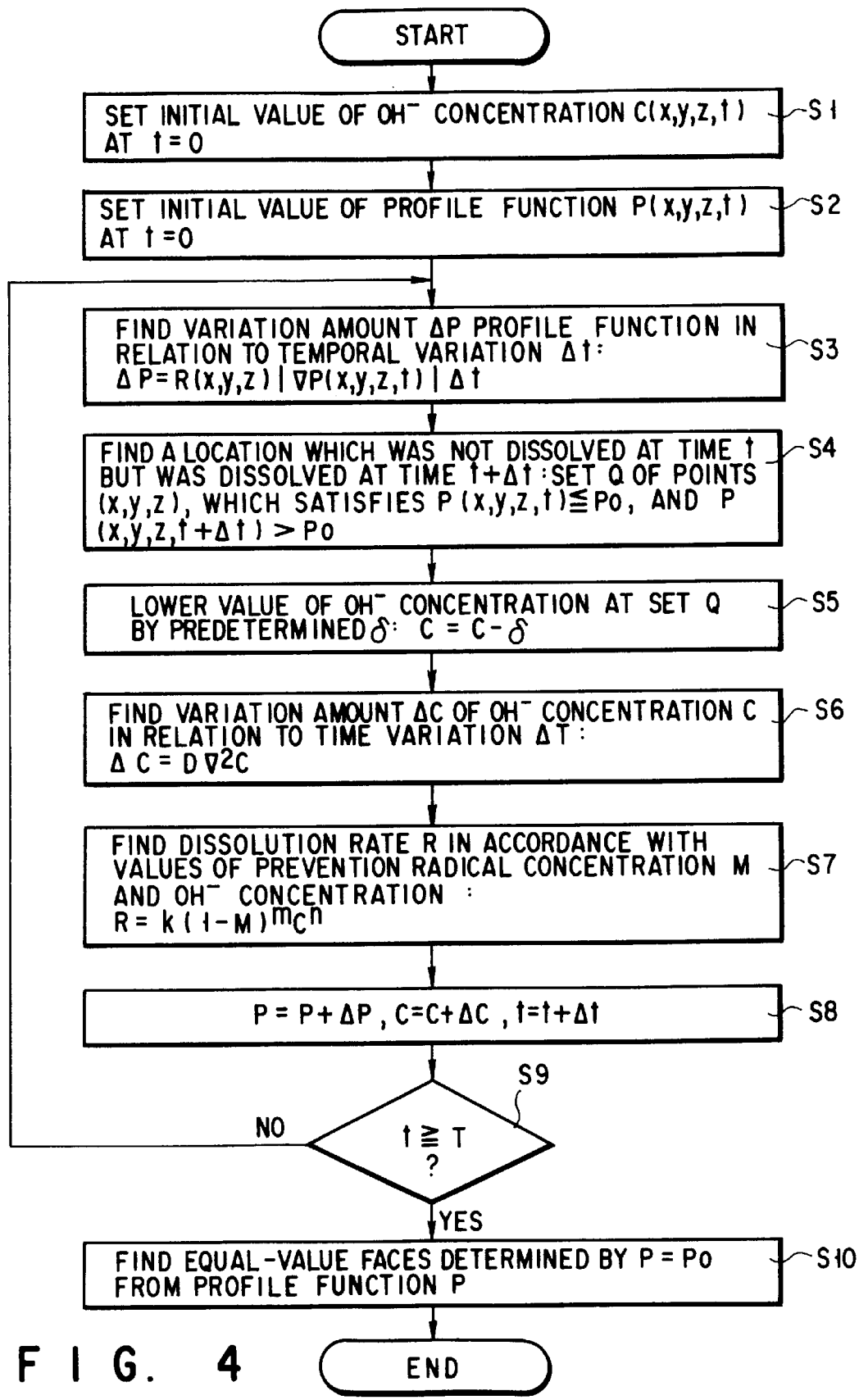
FIG. 4 is a flow chart illustrating a profile simulation method according to a first embodiment of the present invention.

The profile simulation method according to this embodiment will now be described with reference to the flow chart of FIG. 4.

An initial value of a partial differential equation of equation (1) is set (step S1).

An initial value of a partial differential equation of equation (2) is set (step S2)

A variation amount $\Delta P$ of the profile function in relation to a temporal variation $\Delta t$ is found (step S3).

A location, which was not dissolved at a time t but was dissolved at a time $t+\Delta t$, is found. Specifically, the profile function at a non-dissolved portion takes a value exceeding a certain threshold value (Po), and the profile function at a dissolved portion takes a value equal to or less than the threshold value (Po). Thus, a set Q of points (x, y, z) given by the following formula is found (step S4):

$$P(x,y,z,t) \leq Po,$$

and $$P(x,y,z,t+\Delta t)>Po \quad (5)$$

At the points of set Q, the resist dissolves during a time period between time t and time $t+\Delta t$. Accordingly, the $OH^-$ concentration $C(x, y, z, t+\Delta t)$ at the points of set Q decreases. If the degree of the decrease is expressed by 6, the following equation is obtained (step S5):

$$C(x,y,z,t+\Delta t)=C(x,y,z,t)-\delta \quad (6)$$

Subsequently, the diffusion of $OH^-$ concentration distribution is calculated.

Since the $OH^-$ concentration near the dissolved resist portion has decreased in the time period between time t and time $t+\Delta t$, $OH^-$ diffuses in the peripheral region. If the diffusion coefficient is expressed by D, the variation amount of $OH^-$ concentration in the time period between time t and time $t+\Delta t$ is given by the following equation (step S6):

$$\Delta C = D\nabla^2(x,y,z,t) \quad (7)$$

A dissolution rate $R(x, y, z, t)$ in a region in contact with the developer with the $OH^-$ concentration of $C(x, y, z, t+\Delta t)$ is given by the following equation (step S7):

$$R(x,y,z,t+\Delta t)=k[1-M(x,y,z)]^m C(x,y,z,t+\Delta t)^n \quad (8)$$

The variation amount in the period from time t to time $t+\Delta t$ is added to the profile function P, $OH^-$ concentration C and time t (step S8).

It is then determined whether or not time t has reached development end time T (step S9). If the time t has not yet reached the development end time T, the operations of steps S3 to S8 are repeated.

In step S9, when it was determined that the time t reached the development end time T, equal-value planes obtained by slicing the profile function with a certain value (Po) are obtained (step S10), and a resist profile after development is provided.

Using the equations (1) to (4), the dimensions of a finished pattern including an isolated pattern and a concentrated pattern can be exactly estimated.

(Second Embodiment)

A profile simulation method according to a second embodiment of the present invention will now be described. In the profile simulation method according to the first embodiment, a great deal of time is needed to solve the two differential equations without self-inconsistency. In the second embodiment, a calculation time is decreased by simplifying the model.

As is shown in FIG. 3, the etch-away time is shorter in the isolated pattern than in the dense pattern, and thus the time for forming the side wall is longer in the isolated pattern. After the etch-away time, the amount of resist dissolved in the developer decreases extremely. As a result, the OH$^-$ concentration in the peripheral region increases.

Consequently, the dissolution rate of resist increases. Because of this, the dimensions of the finished isolated pattern decrease. To achieve this effect in the simulation, a spatial average expressed by the following equation is considered:

$$G(x,y)=\iint dx'dy' I(x,y) \exp[-\{(x-x')^2+(y-y')^2\}/k^2] \quad (9)$$

In equation (9), I (x, y) indicates an optical image averaged in the film thickness direction z. In the case of a positive type resist, as shown in FIG. 2, the light intensity is high in the vicinity of the isolated pattern portion and G (x, y) takes a large value. On the other hand, in the dense pattern portion, the peak intensity of I (x, y) is lower than in the isolated pattern portion and dense periodically to the vicinity of zero. Thus, with γ set at a positive constant, the dissolution rate is modulated according to the following equation:

$$\frac{R'(x,y)}{R(x,Y)} = 1 + \gamma[G(x,y) - G_0] \quad (10)$$

In equation (10), R (x, y) is a dissolution rate distribution converted from a light intensity distribution within the resist film on the basis of the relationship between an exposure amount and a dissolution rate. R' (x, y) denotes a dissolution rate after modulation, and Go is a constant.

It is understood, from equations (9) and (10), that the dissolution rate is high in the vicinity of the isolated pattern portion and low in the vicinity of the dense pattern portion. In the case of a negative type resist, γ is set at a negative value.

Figure 5:
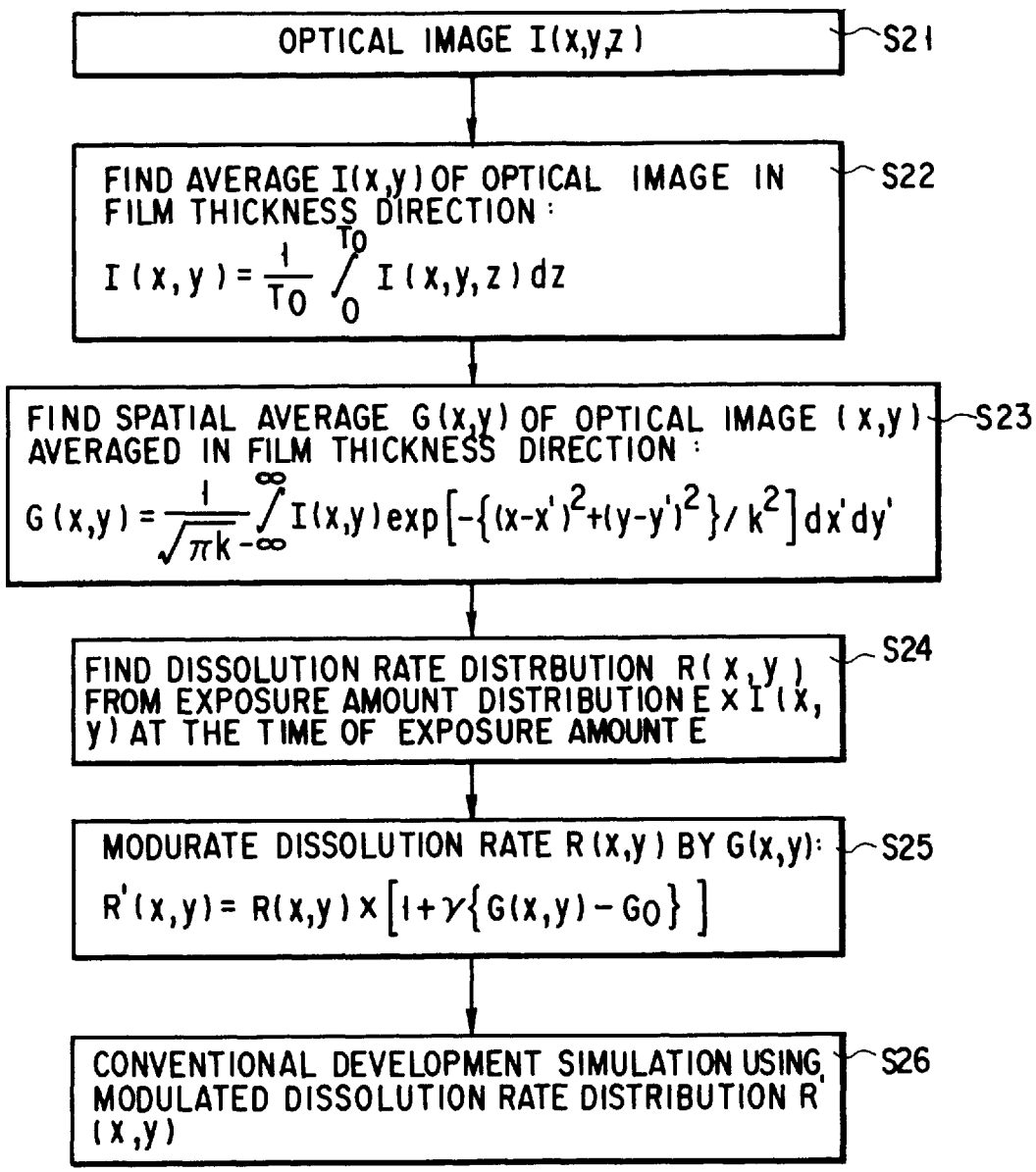
FIG. 5 is a flow chart illustrating a profile simulation method according to a second embodiment of the present invention.

The profile simulation method according to this embodiment will now be described with reference to FIG. 5.

At first, an optical image I (x, y, z) of a resist is obtained (step S21).

Using the optical image I (x, y, z) of the resist, the optical image is averaged in the film thickness direction, thus finding an average I (x, y) of the optical image in the film thickness direction (step S22).

Subsequently, a spatial average G (x, y) of the optical image I (x, y) as averaged in the film thickness direction is found (step S23).

A dissolution rate distribution R (x, y) is obtained from an exposure amount distribution E×I (x, y), by using a relationship between the exposure amount E and the dissolution rate, which relationship has been obtained in advance (step S24).

A dissolution rate R' (x, y) modulated by the OH$^-$ concentration in the developer is found (step S25). Specifically, the dissolution rate R (x, y) is modulated by the spatial average G (x, y).

Then, using a modulated dissolution rate distribution R' (x, y), conventional development simulation is carried out.

In the model adopted in the conventional development simulation, the dissolution rate does not depend on the OH$^-$ concentration but does depend on only the exposure amount and/or dissolution inhibitor concentration. In the present invention, the premodulated dissolution rate R (x, y) is found and the development simulation is carried out by considering the effect of the OH$^-$ concentration.

Figure 6:
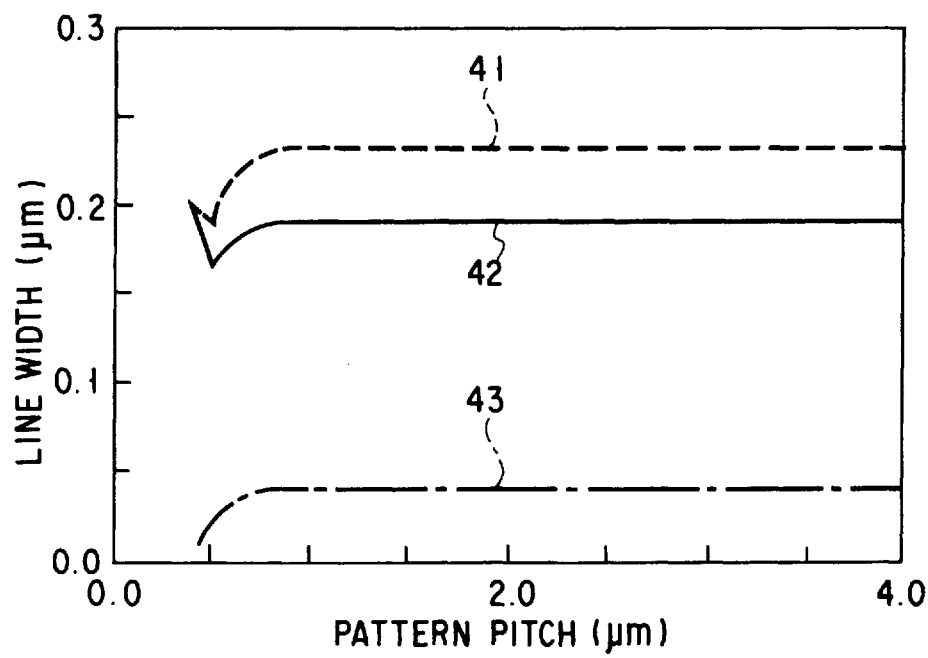
FIG. 6 shows a result obtained by the profile simulation method according to the second embodiment.

FIG. 6 shows a result obtained by the profile simulation method according to the second embodiment. In this case, profile simulation for a one-dimensional pattern was carried out.

The conditions for exposure are λ=248 nm; numerical aperture NA=0.6; and coherence factor σ=0.5. A half-tone phase shift mask was used. The one-dimensional pattern was obtained by calculating the pitch dependency on the basis of a line of 0.2 μm.

In the profile simulation method, k=0.25 μm, γ=4.0, and Go=0.267.

In FIG. 6, a broken line 41 indicates a result obtained by a conventional profile simulation method, and a solid line 42 indicates a result obtained by a the profile simulation method according to the present embodiment. A dot-and-dash line 43 indicates a difference between the broken line 41 and solid line 42.

As is shown in FIG. 6, as the pattern pitch increases, the line width becomes less than in the conventional method. When the pattern pitch exceeds a certain value, the difference levels off.

A description will now be given of the profile simulation method of the present embodiment, which was carried out for a two-dimensional pattern.

FIG. 7 shows a mask pattern which is to be simulated by the profile simulation method of this embodiment.

This mask pattern, as shown in FIG. 7, includes both an isolated pattern and a periodical pattern.

In this profile simulation method of this embodiment, a profile of a finished resist obtained by exposure with use of this mask pattern is calculated.

The conditions for exposure are: λ=248 nm, NA=0.5, σ=0.5, and ε=0.67. A positive type resist is used. Like the first embodiment, the light intensity distribution is averaged in the film thickness direction of the resist, and the distribution lies in a two-dimensional plane.

FIG. 8 shows a simulated resist profile obtained after development of the mask pattern shown in FIG. 7, by means of the profile simulation method of this embodiment.

FIG. 8 also shows a result of conventional simulation in which a dissolution rate is not modulated.

In FIG. 8, a solid line 51 shows a simulation result obtained by the profile simulation method of the present embodiment, and a solid line 52 shows a simulation result obtained by the conventional profile simulation method.

It is understood, as shown in FIG. 8, that in the profile simulation method of this embodiment, the dimensions of the isolated pattern portion decreased. At end portions of periodical pattern portions, shortening occurred.

Accordingly, in the profile simulation method of this embodiment, even if the mask pattern includes both the isolated pattern portion and the pattern portion, the profile of the developed resist can be exactly simulated.

(Third Embodiment)

A profile simulation method according to a third embodiment of the present invention will now be described.

In this embodiment, a location on a desired mask pattern, which is limited for formation of a device, is regarded as a region-of-interest.

In order to obtain a region-of-interest having desired dimensions, the following items and parameters are found: conditions relating to a mask, i.e. a mask bias, an auxiliary pattern, the type of mask (e.g. chrome mask, half-tone phase shift mask, Levenson type phase shift mask); and optimal values for exposure conditions, e.g. numerical aperture NA, coherence factor σ, and light source shape ε.

FIG. 9 is a flow chart illustrating the profile simulation method according to the third embodiment of the present invention.

At first, the desired dimensions of (at least two) regions-of-interest are set at wo (wo1, wo2), the allowance thereof is set at δ, and initial values of proper mask conditions and exposure conditions are set (step S31).

Then, under the conditions set in step S31, the optical image distribution I (x, y, z) within the resist film are calculated and averaged in the film thickness direction (step S32).

A dissolution rate distribution R (x, y) is found from dissolution rate characteristics R (E) at the time of total-face exposure. In addition, a spatial average of the optical image distribution I (x, y) averaged in the film thickness direction of the resist is obtained. On the basis of a value G (x, y) of the spatial average, the dissolution rate is modulated (step S33).

The method of modulating the dissolution rate was already described in connection with the second embodiment of the invention. The method of modulating the dissolution rate may be the same as that described in connection with the first embodiment of the invention.

Using the modulated dissolution rate R' (x, y), the profile of a developed resist is calculated (step S34).

Then, the dimensions w of the finished regions-of-interest are found (step S35) and compared with desired dimensions wo (step S36).

In step S36, if the difference between the dimensions w of the finished regions-of-interest and desired dimensions wo is less than the allowance δ, the calculation is finished. Otherwise, the conditions relating to the mask and exposure are altered (step S37) and the above calculation process is repeated.

According to the present embodiment, the conditions for the mask and exposure for finishing a desired resist pattern can be exactly found.

In the present embodiment, unlike the prior art, there is no need to perform actual exposure, observe a finished resist pattern by means of an electron microscope and repeat experiments until a desired pattern is obtained. Therefore, a mask for obtaining a desired pattern can be easily designed.

The present invention is not limited to the above embodiments and can be modified without departing from the spirit of the invention.

In the first to third embodiments, the development by dissolution of the resist in the photolithography was described. The present invention, however, is not limited to the photolithography. This invention is applicable to the development by dissolution of the resist in electron beam lithography or x-ray lithography, in which the presence of the relation between beam intensity and dissolution rate is known.

The present invention is not limited to the development by dissolution of the resist. This invention is applicable to the profile simulation of various thin films processed by etching.

The methods of the embodiments of the invention may be stored, as computer processing programs, in storage media such as magnetic disks (floppy disks, hard disks), optical disks (CD-ROMs, DVDs, etc.), and semiconductor memories.

As has been described above in detail, according to the present invention, it is possible to exactly estimate the profile of a film to be processed, irrespective of whether the resist pattern includes an isolated pattern portion or a dense pattern portion, by varying the processing speed at predetermined locations on the film in accordance with the degree of processing per unit time at the predetermined locations and the rate of dispersion of the film to the peripheral region thereof.

In particular, when the method of this invention is applied to the resist, the profile of the developed resist is exactly estimated. Thus, it is possible to easily find the conditions for exposure and the mask pattern for obtaining a desired resist pattern having a predetermined process allowance.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A profile simulation method for estimating a profile of a film to be processed, provided on a substrate, which profile varies due to dissolution in a developer, the method comprising:

a first step of calculating, on the basis of a dissolution rate of the film, a profile function variation amount representing a difference between a profile function representing the profile of the film at a first time point and a profile function at a second time point;

a second step of calculating a set of points having values of the profile function within a predetermined range between the first time point and the second time point;

a third step of lowering a dissolution component concentration of the developer among dissolution component concentrations, which dissolution component concentration is associated with the set of points;

a fourth step of calculating a variation amount between the dissolution component concentration at the first time point and the dissolution component concentration at the second time point;

a fifth step of calculating a dissolution rate of the film on the basis of a dissolution inhibitor concentration at the first time point and the dissolution component concentration of the developer;

a sixth step of varying the profile function, the dissolution component concentration and the first time point, respectively by the variation amount of the profile function, the variation amount of the dissolution component concentration and the variation amount between the first time point and the second time point;

a seventh step of determining whether or not the varied first time point has reached a development time of the film; and an eighth step of obtaining, when it has been determined that the varied first time point has reached the development time, the profile of the film by extracting equal-value faces of the varied profile function.

2. The profile simulation method according to claim 1, further comprising:

a ninth step of repeating the first to seventh steps until the varied first time point reaches the development time.

3. A computer program product for operating a computer, said computer program product comprising:

a computer readable medium;

first program instruction means for instructing a computer processor to calculate, on the basis of a dissolution rate of a film on a substrate, which film is dissolved in a developer, a profile function variation amount representing a difference between a profile function representing a profile of the film at a first time point and a profile function at a second time point;

second program instruction means for instructing the computer processor to calculate a set of points having values of the profile function within a predetermined range between the first time point and the second time point;

third program instruction means for instructing the computer processor to lower a dissolution component concentration of the developer among dissolution component concentrations, which dissolution component concentration is associated with the set of points;

fourth program instruction means for instructing the computer processor to calculate a variation amount between the dissolution component concentration at the first time point and the dissolution component concentration at the second time point;

fifth program instruction means for instructing the computer processor to calculate a dissolution rate of the film on the basis of a dissolution inhibitor concentration at the first time point and the dissolution component concentration of the developer;

sixth program instruction means for instructing the computer processor to vary the profile function, the dissolution component concentration and the first time point, respectively by the variation amount of the profile function, the variation amount of the dissolution component concentration and the variation amount between the first time point and the second time point;

seventh program instruction means for instructing the computer processor to determine whether or not the varied first time point has reached a development time of the film; and eighth program instruction means for instructing the computer processor to obtain, when it has been determined that the varied first time point has reached the development time, the profile of the film by extracting equal-value faces of the varied profile function, wherein each of said program instruction means is recorded on said medium in executable form and is loadable into the computer for execution by the processor.

4. The computer program product as set forth in claim 3, further comprising:

ninth program instruction means for instructing the computer processor to repeat the first to seventh steps until the varied first time point reaches the development time.

5. A profile simulation method for estimating a profile of a film to be processed, provided on a substrate, which profile varies due to dissolution in a developer, the method comprising:

a first step of calculating a distribution of an optical image of the film, which optical image has been averaged in a film thickness direction of the film;

a second step of calculating a spatial average of the averaged optical image distribution;

a third step of calculating a dissolution rate of the film;

a fourth step of modulating the calculated dissolution rate with use of the calculated spatial average; and a fifth step of simulating the profile of the film by using the modulated dissolution rate.

6. A computer program product for operating a computer, said computer program product comprising:

a computer readable medium;

first program instruction means for instructing a computer processor to calculate a distribution of an optical image on a film provided on a substrate, which optical image has been averaged in a film thickness direction of the film;

second program instruction means for instructing the computer processor to calculate a spatial average of the averaged optical image distribution;

third program instruction means for instructing the computer processor to calculate a dissolution rate of the film;

fourth program instruction means for instructing the computer processor to modulate the calculated dissolution rate with use of the calculated spatial average; and fifth program instruction means for instructing the computer processor to simulate the profile of the film by using the modulated dissolution rate, wherein each of said program instruction means is recorded on said medium in executable form and is loadable into the computer for execution by the processor.

7. A profile simulation method for determining initial values for forming a film in a desired profile, the method comprising:

a first step of setting initial values for calculating an optical image of the film provided on a substrate;

a second step of calculating the optical image on the basis of the initial values;

a third step of varying a dissolution rate of the film on the basis of a dissolution component dissolving the film;

a fourth step of calculating a profile of the film by using the varied dissolution rate;

a fifth step of calculating dimensions of the film at a plurality of locations in the calculated profile of the film;

a sixth step of determining whether or not a difference between the calculated dimensions of the film and predetermined dimensions is within a predetermined range; and a seventh step of varying, when it has been determined that the difference between the calculated dimensions of the film and the predetermined dimensions is without the predetermined range, the initial values, and repeating the second to sixth steps.

8. A computer program product for operating a computer, said computer program product comprising:

a computer readable medium;

first program instruction means for instructing a computer processor to set initial values for calculating an optical image of the film provided on a substrate;

second program instruction means for instructing the computer processor to calculate the optical image on the basis of the initial values;

third program instruction means for instructing the computer processor to vary a dissolution rate of the film on the basis of a dissolution component dissolving the film;

fourth program instruction means for instructing the computer processor to calculate a profile of the film by using the varied dissolution rate;

fifth program instruction means for instructing the computer processor to calculate dimensions of the film at a plurality of locations in the calculated profile of the film;

sixth program instruction means for instructing the computer processor to determine whether or not a difference between the calculated dimensions of the film and predetermined dimensions is within a predetermined range; and seventh program instruction means for instructing the computer processor to vary, when it has been determined that the difference between the calculated dimensions of the film and the predetermined dimensions is without the predetermined range, the initial values, and repeating the second to sixth steps, wherein each of said program instruction means is recorded on said medium in executable form and is loadable into the computer for execution by the processor.

\* \* \* \* \*